(12) United States Patent
Hsu et al.

(10) Patent No.: US 12,580,562 B2
(45) Date of Patent: Mar. 17, 2026

(54) SLEW RATE MITIGATION CIRCUIT AND METHOD THEREFOR

(71) Applicant: REALTEK SEMICONDUCTOR CORP., Hsinchu (TW)

(72) Inventors: Hao-Cheng Hsu, Hsinchu (TW); Yu-Ting Chung, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 49 days.

(21) Appl. No.: 18/408,755

(22) Filed: Jan. 10, 2024

(65) Prior Publication Data

US 2024/0259016 A1 Aug. 1, 2024

(30) Foreign Application Priority Data

Feb. 1, 2023 (TW) ................................. 112103535

(51) Int. Cl.
*H03K 17/00* (2006.01)
*H03K 17/16* (2006.01)
*H03K 19/20* (2006.01)

(52) U.S. Cl.
CPC ........... *H03K 17/165* (2013.01); *H03K 19/20* (2013.01)

(58) Field of Classification Search
CPC ........ H03K 17/16; H03K 17/161; H03K 5/12; H03K 5/1252; H03K 5/1534
See application file for complete search history.

(56) References Cited

U.S. PATENT DOCUMENTS

| | | | | |
|---|---|---|---|---|
| 6,340,941 B1* | 1/2002 | Miura | .................... | H03K 5/088 |
| | | | | 341/139 |
| 6,624,683 B1* | 9/2003 | Bedarida | .............. | H03K 17/063 |
| | | | | 327/377 |
| 7,218,175 B1* | 5/2007 | Kobayashi | ................ | H03F 1/30 |
| | | | | 330/296 |
| 8,199,929 B2* | 6/2012 | Chi | ........................ | H04R 3/007 |
| | | | | 381/94.5 |
| 8,421,383 B2* | 4/2013 | Horng | ........................ | H02P 6/22 |
| | | | | 318/507 |
| 2002/0079950 A1* | 6/2002 | Rose | .......................... | G06F 1/26 |
| | | | | 327/530 |
| 2004/0021506 A1 | 2/2004 | Tanase | | |
| 2009/0167413 A1* | 7/2009 | Im | ........................... | G11C 7/04 |
| | | | | 327/512 |
| 2010/0246859 A1 | 9/2010 | David et al. | | |
| 2017/0205470 A1* | 7/2017 | Li | .......................... | G01R 31/40 |
| 2022/0109410 A1 | 4/2022 | Tong et al. | | |

FOREIGN PATENT DOCUMENTS

TW 201031116 A1 8/2010

* cited by examiner

*Primary Examiner* — Tuan T Lam
(74) *Attorney, Agent, or Firm* — Birch, Stewart, Kolasch & Birch, LLP

(57) ABSTRACT

A slew rate mitigation circuit includes a slew rate mitigation unit, a switch unit, and a control unit. The slew rate mitigation unit is configured to receive an input signal through an input terminal and generate an output signal at an output terminal at a mitigation rate according to the input signal. The switch unit is coupled between the input terminal and the output terminal. The control unit is configured to selectively turn on the switch unit according to the output signal. The switch unit builds a fast charging path from the input terminal to the output terminal when turned on and cuts off the fast charging path when turned off.

4 Claims, 10 Drawing Sheets

100

S30

SLEW RATE MITIGATION CIRCUIT AND METHOD THEREFOR

CROSS-REFERENCE TO RELATED APPLICATION

This non-provisional application claims priority under 35 U.S.C. § 119(a) to Patent Application No. 112103535 filed in Taiwan, R.O.C. on Feb. 1, 2023, the entire contents of which are hereby incorporated by reference.

BACKGROUND

Technical Field

The present invention relates to slew rate mitigation technologies, and in particular, to a slew rate mitigation circuit a method therefor.

Related Art

Some circuits are prone to a function failure due to quick turn-on/off. In order to reduce the situation, a slew rate of an input signal is usually reduced through a slew rate mitigation circuit and then outputted to the circuits.

Conventionally, in order to reduce the design complexity, the slew rate mitigation circuit is usually implemented by an RC ladder circuit. In order to reduce a required layout area, a large resistance is used to reduce a cut-off frequency of a low-pass filter. However, the above operation increases an output impedance of an output terminal, which causes the output terminal to be affected by noise coupling.

SUMMARY

In an embodiment, the present invention provides a slew rate mitigation circuit. The slew rate mitigation circuit includes a slew rate mitigation unit, a switch unit, and a control unit. The slew rate mitigation unit is configured to receive an input signal through an input terminal and generate an output signal at an output terminal at a mitigation rate according to the input signal. The switch unit is coupled between the input terminal and the output terminal. The control unit is configured to selectively turn on the switch unit according to the input signal and the output signal. The switch unit establishes a fast charging path from the input terminal to the output terminal when turned on and cuts off the fast charging path when turned off.

In an embodiment, the present invention provides a slew rate mitigation method. The slew rate mitigation method includes: receiving an input signal through an input terminal; generating an output signal at an output terminal at a mitigation rate according to the input signal; and selectively establishing a fast charging path from the input terminal to the output terminal according to the output signal.

According to the slew rate mitigation circuit and the slew rate mitigation method of any embodiment, the output signal is generated at the output terminal at the mitigation rate according to the input signal, and the fast charging path from the input terminal to the output terminal is selectively established according to the output signal, so that the output signal can have weak driving force at an initial stage of transition to prevent a post-stage circuit from suffering from serious charge sharing, that is, prevent a non-ideal effect (such as charge sharing) caused by fast transition, and the output signal can have strong driving force in a late stage of transition to prevent interference from noise after the transition.

Detailed features and advantages of the present invention are described in detail in the following implementations, which are sufficient for any person skilled in the art to understand the technical content of the present invention and implement the operations accordingly. According to the content disclosed in this specification, the scope of patent application, and the drawings, any person skilled in the art can easily understand related objectives and advantages of the present invention.

DETAILED DESCRIPTION

In order to make the above purposes, features, and advantages of embodiments of the present invention more obvious and understandable, detailed description is provided below with reference to the drawings.

It should be understood that the word "include" used in the description indicates existence of specific technical features, values, method steps, operations and processing, elements, and/or assemblies, but does not exclude more technical features, values, method steps, operations and processing, elements, assemblies, or any combination of the above.

Figure 1:
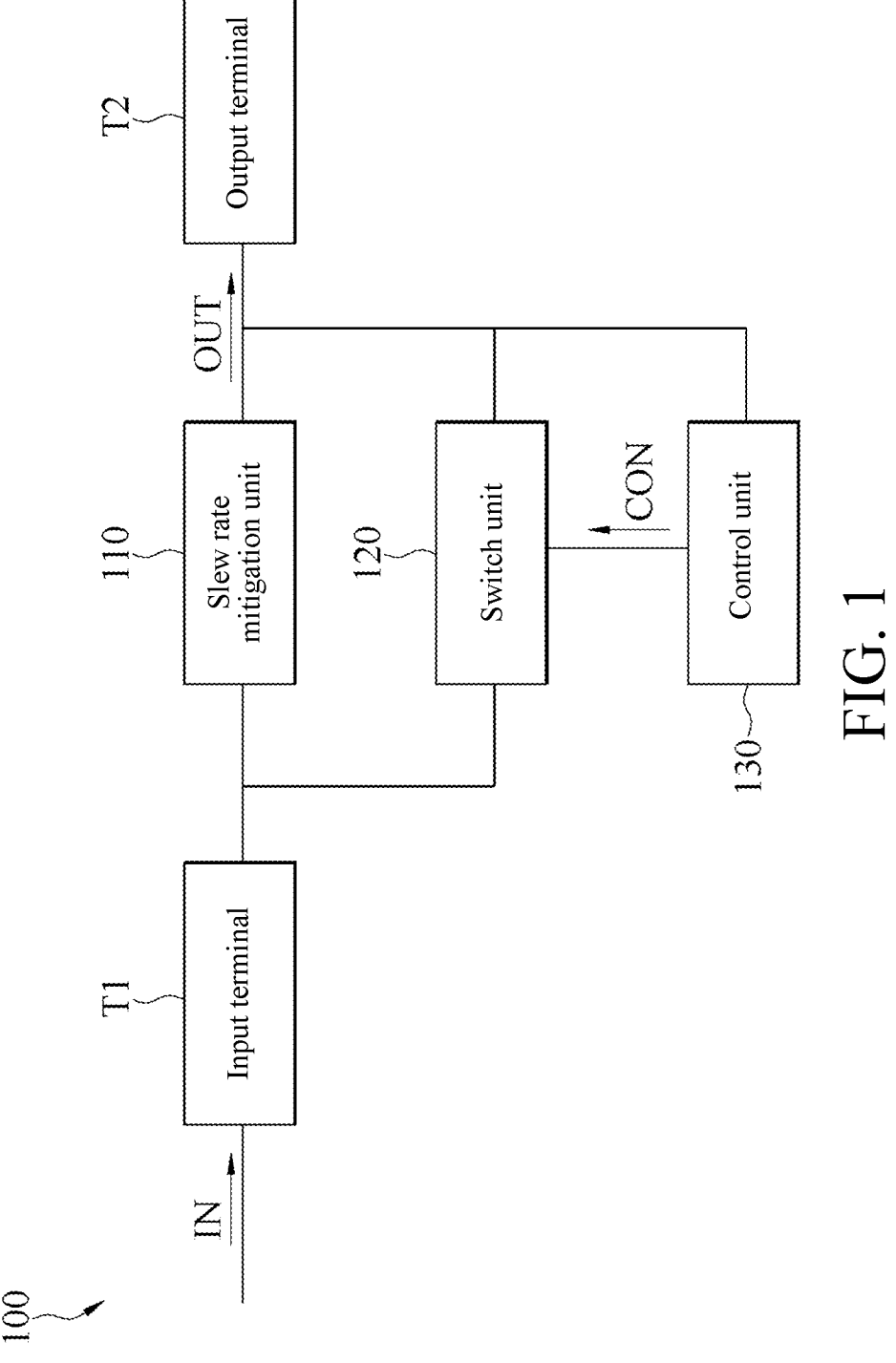
FIG. 1 is a block diagram of an embodiment of a slew rate mitigation circuit.

FIG. 1 is a block diagram of an embodiment of a slew rate mitigation circuit. A slew rate mitigation circuit 100 has an input terminal T1 and an output terminal T2. The slew rate mitigation circuit 100 is configured to receive, through the input terminal T1, an input signal IN provided by a pre-stage circuit (not shown in the figure), and may generate, according to a slew rate mitigation method in any embodiment, an output signal OUT after slew rate mitigation at the output terminal T2 to a post-stage circuit (not shown in the figure). In some implementations, the post-stage circuit may be a circuit prone to a function attenuation (such as a failure) due to quick turn-on/off. For example, a linear equalizer with intermediate frequency compensation is prone to error bits due to charge sharing generated when a compensation capacitor is turned on/off quickly in an adaptive process.

In an embodiment, the slew rate mitigation circuit 100 includes a slew rate mitigation unit 110, a switch unit 120, and a control unit 130. The slew rate mitigation unit 110 is coupled between the input terminal T1 and the output terminal T2. The switch unit 120 is coupled between the input terminal T1 and the output terminal T2. In other words, the slew rate mitigation unit 110 and the switch unit 120 may be connected in parallel between the input terminal T1 and the output terminal T2. The control unit 130 is coupled to the output terminal T2 and the switch unit 120. The slew rate mitigation unit 110 is configured to mitigate a speed at which the input signal IN inputted through the input terminal T1 directly pushes the output terminal T2. The control unit 130 is configured to generate a control signal CON to the switch unit 120 to control on/off of the switch unit 120.

In some embodiments, the slew rate mitigation unit 110 has a mitigation rate. The slew rate mitigation unit 110 may mitigate a slew rate of a rising edge and/or a falling edge of the input signal IN at the mitigation rate, and generate the output signal OUT after the slew rate mitigation at the output terminal T2. A slew rate of a rising edge and/or a falling edge of the output signal OUT relates to the mitigation rate of the slew rate mitigation unit 110. A larger mitigation rate of the slew rate mitigation unit 110 leads to a smaller slew rate (that is, a larger slew rate mitigation degree) of the rising edge and/or the falling edge of the output signal OUT generated by the slew rate mitigation unit 110. On the contrary, a smaller mitigation rate of the slew rate mitigation unit 110 leads to a larger slew rate (that is, a smaller slew rate mitigation degree) of the rising edge and/or the falling edge of the output signal OUT generated by the slew rate mitigation unit 110. In some implementations, the slew rate mitigation unit 110 may be implemented by an RC ladder circuit, but the present invention is not limited thereto. The slew rate mitigation unit 110 may be any circuit applicable to the slew rate mitigation.

In some implementations, the switch unit 120 may be implemented by, for example, an N-type transistor, a P-type transistor, or a transmission gate, but the present invention is not limited thereto. The switch unit 120 may be other circuits applicable to control whether to establish a connection path. In addition, the control unit 130 may be implemented by a suitable logic gate (such as an inverter) or a combined circuit of the logic gate (such as a NAND gate and a NOR gate) according to a logic requirement for controlling the switch unit 120.

Figure 2:
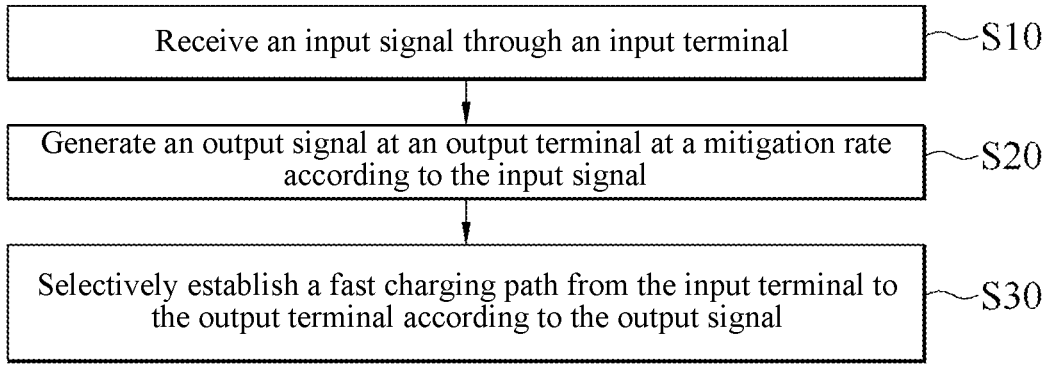
FIG. 2 is a schematic flowchart of an embodiment of a slew rate mitigation method.

FIG. 2 is a schematic flowchart of an embodiment of a slew rate mitigation method. Referring to FIG. 1 and FIG. 2, in an embodiment of the slew rate mitigation method, the slew rate mitigation unit 110 receives, through the input terminal T1, the input signal IN provided by the pre-stage circuit (not shown in the figure) (step S10). The input signal IN may vary between a first potential and a second potential, and the second potential is greater than the first potential. In some implementations, the input signal IN may be a pulse signal, but the present invention is not limited thereto.

The slew rate mitigation unit 110 generates the output signal OUT after the slew rate mitigation at a mitigation rate at the output terminal T2 according to the input signal IN after receiving the input signal IN (step S20). The control unit 130 selectively turns on the switch unit 120 according to the output signal OUT on the output terminal T2, to selectively establish a fast charging path from the input terminal T1 to the output terminal T2 through on/off of the switch unit 120 (step S30). When the switch unit 120 is turned on through the control signal CON, the switch unit 120 establishes the fast charging path from the input terminal T1 to the output terminal T2, so that the input signal IN on the input terminal T1 can directly push the output terminal T2 through the fast charging path, which enhances a load pushing ability of the output signal OUT on the output terminal T2, thereby reducing impact of noise coupling on the output signal OUT. On the contrary, when the switch unit 120 is turned off (that is, disabled) through the control signal CON, the switch unit 120 cuts off the fast charging path from the input terminal T1 to the output terminal T2, so that the input signal IN on the input terminal T1 can push the output terminal T2 only through the slew rate mitigation unit 110.

Figure 3:
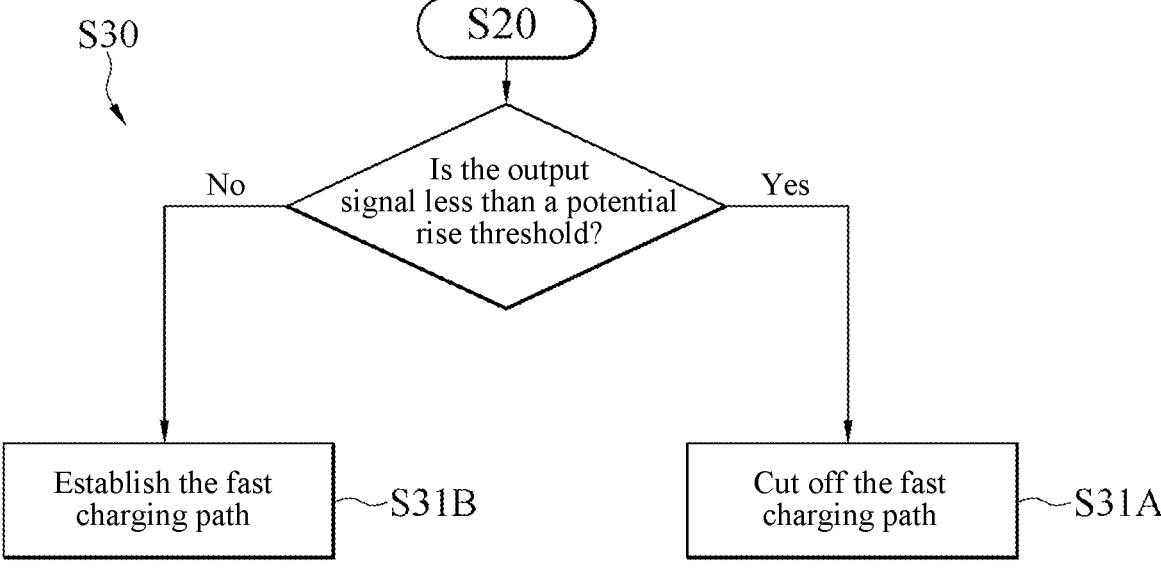
FIG. 3 is a schematic flowchart of an embodiment of step S30.

FIG. 3 is a schematic flowchart of an embodiment of step S30. Referring to FIG. 1 and FIG. 3, in the slew rate mitigation method in an embodiment, the control unit 130 detects the output signal OUT based on a potential rise threshold, to control the switch unit 120.

When the output signal OUT is less than the potential rise threshold, the control unit 130 controls the switch unit 120 to cut off the fast charging path from the input terminal T1 to the output terminal T2 (step S31A). When the output signal OUT is greater than or equal to the potential rise threshold, the control unit 130 controls the switch unit 120 to establish the fast charging path from the input terminal T1 to the output terminal T2 (step S31B).

For example, when the output signal OUT is less than the potential rise threshold, the control unit 130 generates and outputs the control signal CON with a first value to the switch unit 120, to turn off the switch unit 120, that is, to cut off the fast charging path from the input terminal T1 to the output terminal T2. On the contrary, when the output signal OUT is greater than or equal to the potential rise threshold, the control unit 130 generates and outputs the control signal CON with a second value to the switch unit 120, to turn on the switch unit 120, that is, to establish the fast charging path from the input terminal T1 to the output terminal T2. The second value is different from the first value. For example, the first value may be logic 1, and the second value is logic 0, but the present invention is not limited thereto.

In some embodiments, the potential rise threshold may be a logic transition threshold of the control unit 130, and the potential rise threshold is between the first potential and the second potential.

Figure 4:
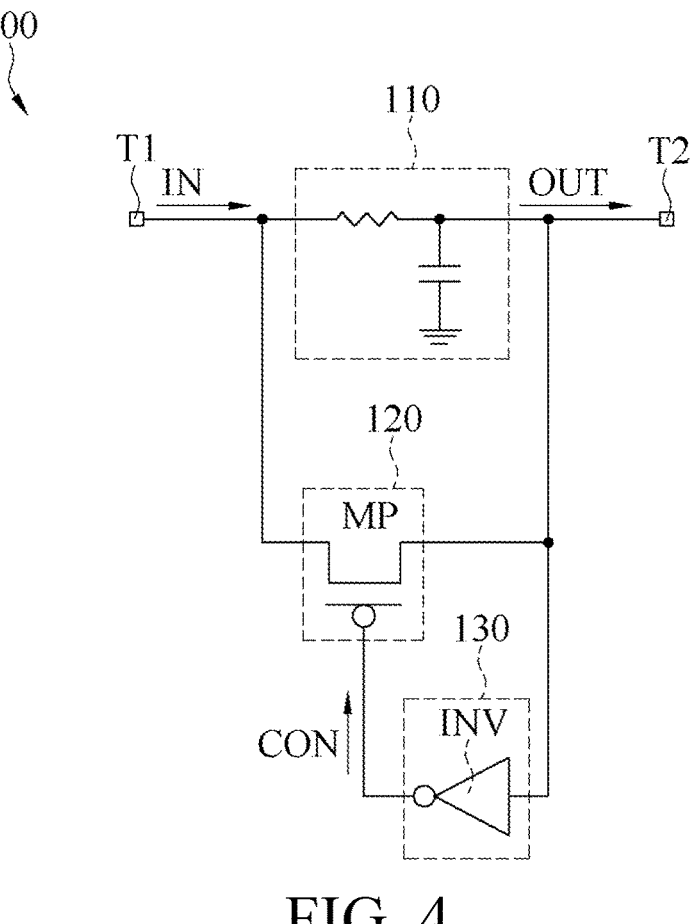
FIG. 4 is a schematic circuit diagram of an embodiment of the slew rate mitigation circuit.
Figure 5:
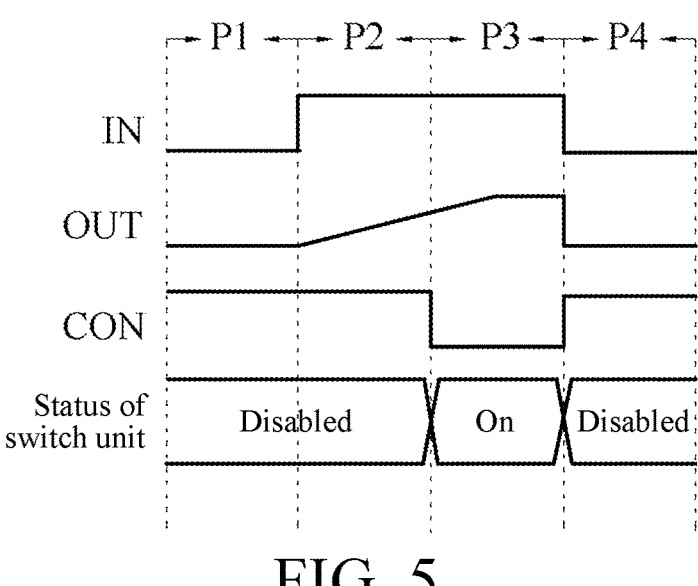
FIG. 5 is a schematic waveform diagram of an embodiment of the slew rate mitigation circuit.

FIG. 4 is a schematic circuit diagram of an embodiment of the slew rate mitigation circuit. FIG. 5 is a schematic waveform diagram of an embodiment of the slew rate mitigation circuit. Referring to FIG. 4 and FIG. 5, in an implementation, a P-type transistor MP is used as (included in) the switch unit 120 and an inverter INV is used as (included in) the control unit 130, for example. Two connecting terminals of the P-type transistor MP are respectively coupled to the input terminal T1 and the output terminal T2, an input terminal of the inverter INV is coupled to the output terminal T2, and an output terminal of the inverter INV is coupled to a control terminal of the P-type transistor MP. In this case, a logic transition threshold of the inverter INV is the potential rise threshold, and the input signal IN is an ideal square wave.

As shown in FIG. 5, each operation cycle of the slew rate mitigation circuit 100 is composed of a first period P1, a second period P2, a third period P3, and a fourth period P4 connected in sequence.

In the first period P1, the input signal IN is at the first potential, and the output signal OUT generated by the slew rate mitigation unit 110 is also at the first potential. In this case, the control unit 130 generates the control signal CON with the first value to disable the switch unit 120 in response to the output signal OUT being less than the potential rise threshold.

In the second period P2, the input signal IN transitions and rises from the first potential to the second potential. At this time, the output signal OUT also transitions, and the output signal OUT slowly rises from the first potential due to the mitigation from the slew rate mitigation unit 110 (a rising speed depends on the mitigation rate of the slew rate mitigation unit 110). In the second period P2, the output signal OUT is still less than the potential rise threshold, and therefore the control unit 130 still generates the control signal CON with the first value to disable the switch unit 120. Weak driving force of the output signal OUT in the second period P2 can prevent the post-stage circuit from suffering from serious charge sharing and thereby avoiding generating error codes.

In the third period P3, the input signal IN remains at the second potential, but the control unit 130 turns to generate the control signal CON with the second value to turn on the switch unit 120 in response to the output signal OUT reaching the potential rise threshold, so that the input signal IN can directly push the output terminal T2 through the fast charging path established by the switch unit 120, thereby enhancing the load pushing ability of the output signal OUT. Strong driving force of the output signal OUT in the third period P3 can prevent interference from noise after completion of the transition.

In the fourth period P4, the input signal IN transitions and drops from the second potential to the first potential, and the output signal OUT transitions and drops from the second potential to the first potential. At this time, the control unit 130 turns to generate the control signal CON with the first value to disable the switch unit 120 in response to the output signal OUT being less than the potential rise threshold.

In some embodiments, the slew rate mitigation circuit 100 may repeatedly perform the process from the first period P1 to the fourth period P4.

Figure 6:
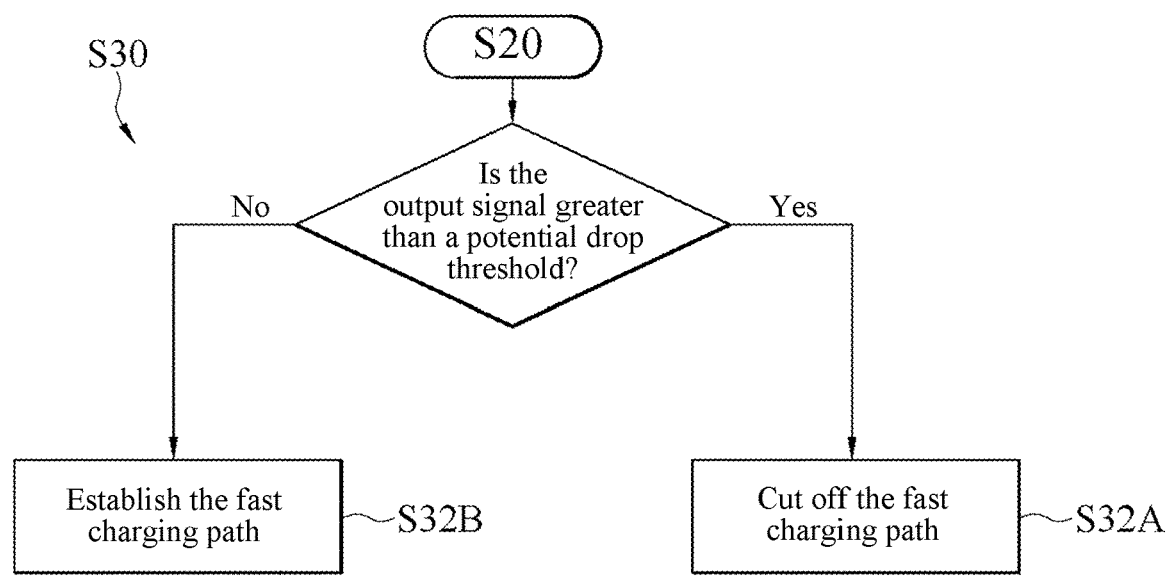
FIG. 6 is a schematic flowchart of an embodiment of step S30.

FIG. 6 is a schematic flowchart of an embodiment of step S30. Referring to FIG. 1 and FIG. 6, in the slew rate mitigation method in an embodiment, the control unit 130 detects the output signal OUT based on a potential drop threshold, to control the switch unit 120.

When the output signal OUT is greater than the potential drop threshold, the control unit 130 generates the control signal CON with the second value to turn off (that is, disable) the switch unit 120, so that the switch unit 120 cuts off the fast charging path from the input terminal T1 to the output terminal T2 when disabled (step S32A). When the output signal OUT is less than or equal to the potential drop threshold, the control unit 130 generates the control signal CON with the first value to turn on the switch unit 120, so that the switch unit 120 establishes the fast charging path from the input terminal T1 to the output terminal T2 when turned on (step S32B). In some embodiments, the potential drop threshold may be a logic transition threshold of the control unit 130, and the potential drop threshold is between the first potential and the second potential.

Figure 7:
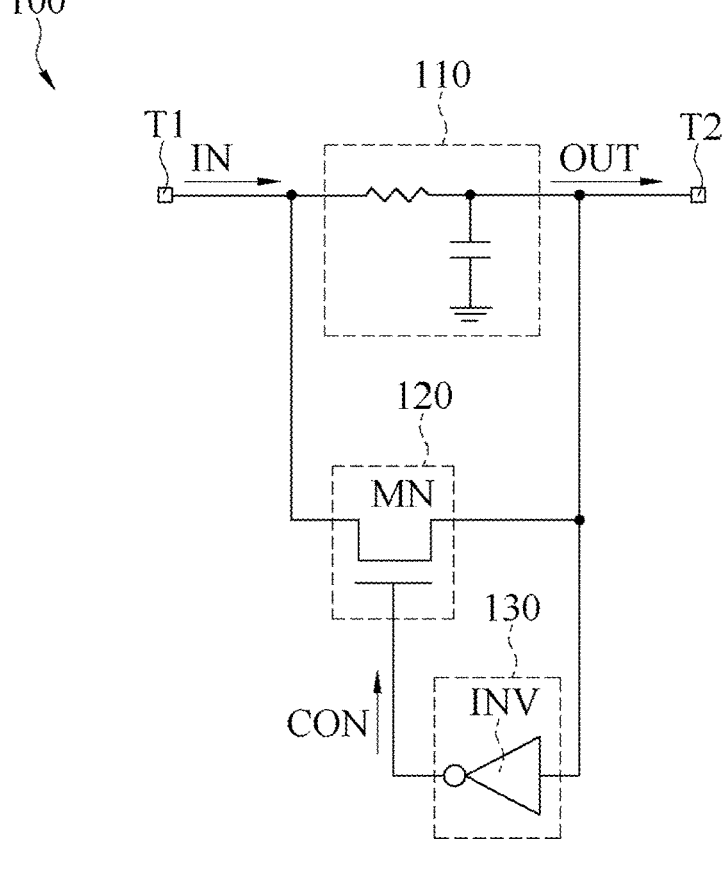
FIG. 7 is a schematic circuit diagram of an embodiment of the slew rate mitigation circuit.
Figure 8:
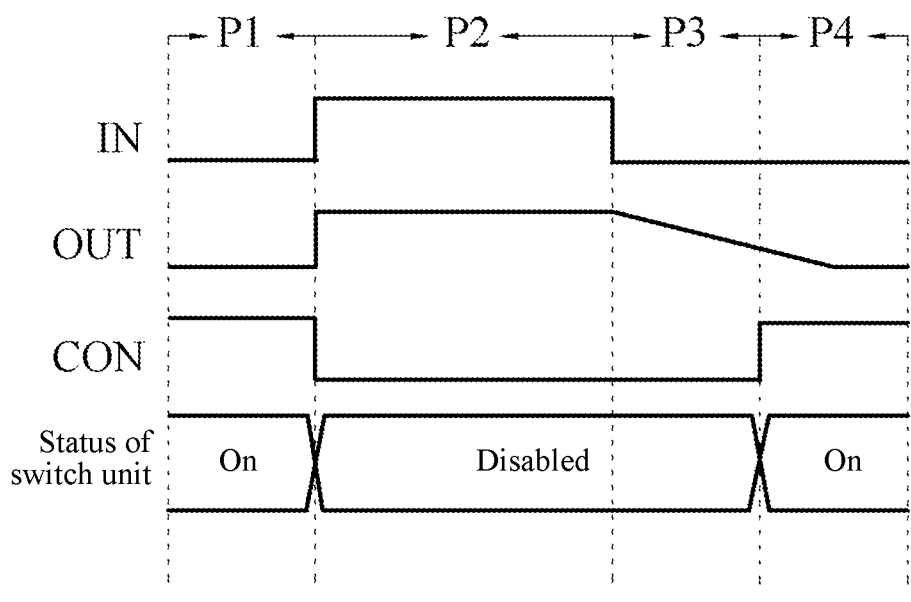
FIG. 8 is a schematic waveform diagram of an embodiment of the slew rate mitigation circuit.

FIG. 7 is a schematic circuit diagram of an embodiment of the slew rate mitigation circuit. FIG. 8 is a schematic waveform diagram of an embodiment of the slew rate mitigation circuit. Referring to FIG. 7 and FIG. 8, in an implementation, an N-type transistor MN is used as (included in) the switch unit 120 and an inverter INV is used as (included in) the control unit 130, for example. Two connecting terminals of the N-type transistor MN are respectively coupled to the input terminal T1 and the output terminal T2, an input terminal of the inverter INV is coupled to the output terminal T2, and an output terminal of the inverter INV is coupled to a control terminal of the N-type transistor MN. In this case, a logic transition threshold of the inverter INV is the potential drop threshold, and the input signal IN may be an ideal square wave.

As shown in FIG. 8, each operation cycle of the slew rate mitigation circuit 100 is composed of a first period P1, a second period P2, a third period P3, and a fourth period P4 connected in sequence.

In the first period P1, the input signal IN is at the first potential, the output signal OUT generated by the slew rate mitigation unit 110 is at the first potential, and the control unit 130 generates the control signal CON with the first value to turn on the switch unit 120 in response to the output signal OUT being less than the potential drop threshold.

In the second period P2, the input signal IN transitions and rises from the first potential to the second potential. At this time, the input signal IN may be transmitted to the output terminal T2 through the fast charging path established by the switch unit 120. Therefore, the output signal OUT on the output terminal T2 also transitions and rises from the first potential to the second potential, and the control unit 130 turns to generate the control signal CON with the second value to disable the switch unit 120 in response to the output signal OUT being greater than the potential drop threshold.

In the third period P3, the input signal IN transitions and drops from the second potential to the first potential. At this time, the output signal OUT transitions, and the output signal OUT slowly drops from the second potential due to the mitigation from the slew rate mitigation unit 110 (a dropping speed depends on the mitigation rate of the slew rate mitigation unit 110). In this third period P3, the dropped output signal OUT is still greater than the potential drop threshold, and therefore the control unit 130 still generates the control signal CON with the second value to disable the switch unit 120. Weak driving force of the output signal OUT in the third period P3 can prevent the post-stage circuit from suffering from serious charge sharing and thereby avoiding generating error codes.

In the fourth period P4, the input signal IN remains at the first potential, but the control unit 130 turns to generate the control signal CON with the first value to turn on the switch unit 120 in response to the output signal OUT dropping to the potential drop threshold, so that the input signal IN can directly push the output terminal T2 through the fast charging path established by the switch unit 120, thereby enhancing the load pushing ability of the output signal OUT. Strong driving force of the output signal OUT in the fourth period P4 can prevent interference from noise after completion of the transition.

In some embodiments, the slew rate mitigation circuit 100 may repeatedly perform the process from the first period P1 to the fourth period P4.

Figure 9:
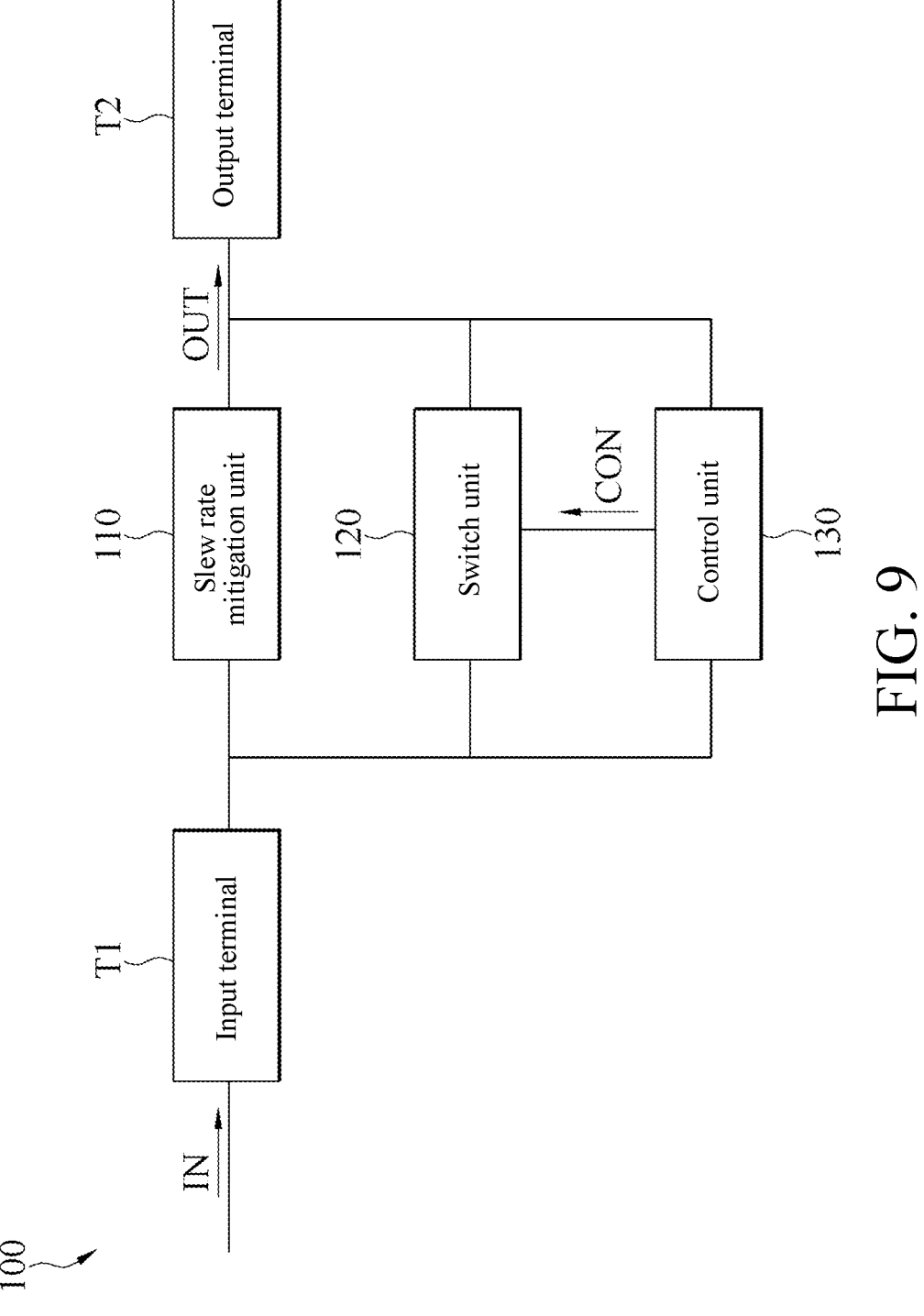
FIG. 9 is a block diagram of an embodiment of a slew rate mitigation circuit.

FIG. 9 is a block diagram of an embodiment of a slew rate mitigation circuit. Referring to FIG. 9, in some embodiments, the control unit 130 of the slew rate mitigation circuit 100 may be further coupled to the input terminal T1 to selectively turn on the switch unit 120 according to the input signal IN and output signal OUT.

Figure 10:
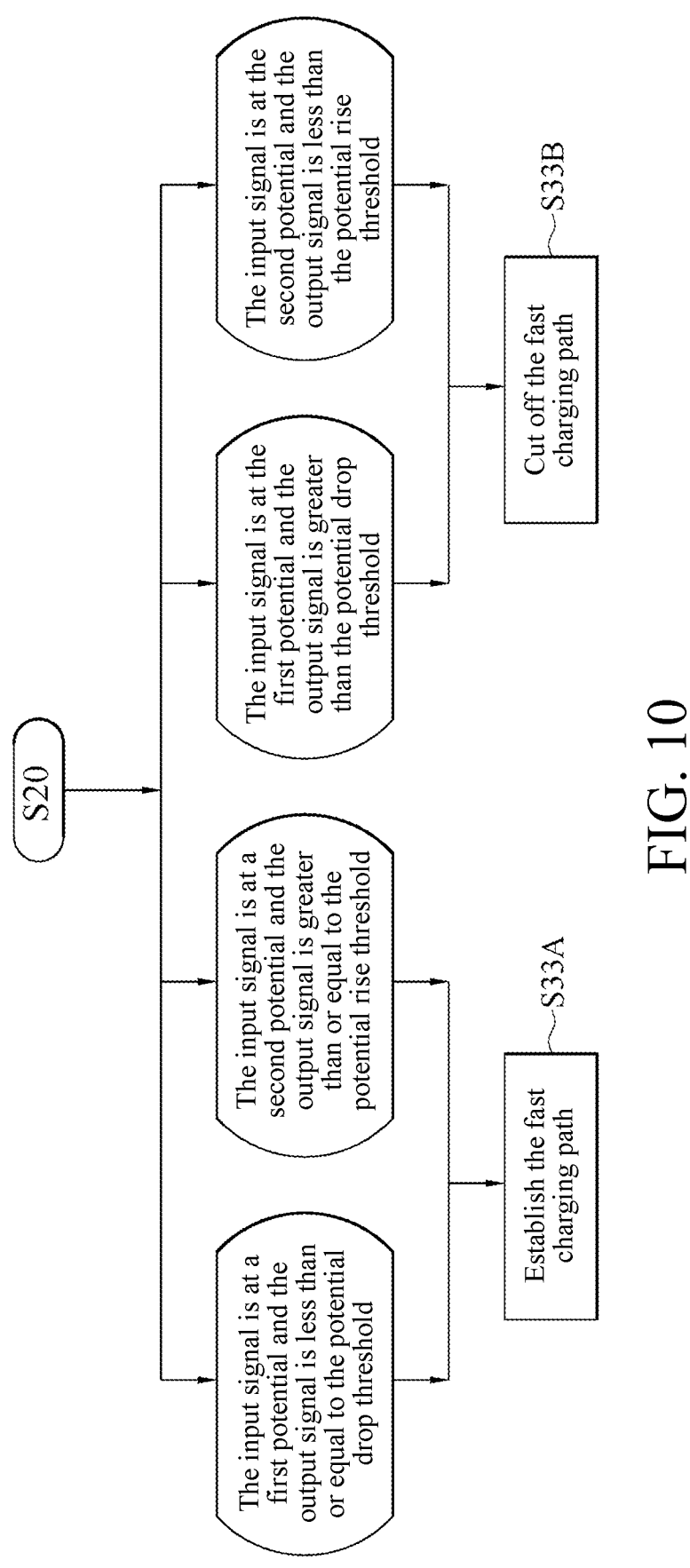
FIG. 10 is a schematic flowchart of an embodiment of step S30.

FIG. 10 is a schematic flowchart of an embodiment of step S30. Referring to FIG. 10, in an embodiment of the slew rate mitigation method, the control unit 130 detects the output signal OUT based on the potential rise threshold and the potential drop threshold, and determines whether to turn on the switch unit 120 according to a detection result and the potential of the input signal IN.

When the input signal IN is at the first potential and the output signal OUT is less than or equal to the potential drop threshold and when the input signal IN is at the second potential and the output signal OUT is greater than or equal to the potential rise threshold, the control unit 130 turns on the switch unit 120, so that the switch unit 120 can establish the fast charging path from the input terminal T1 to the output terminal T2 when turned on (step S33A). The second potential is greater than the first potential. When the input signal IN is at the first potential and the output signal OUT is greater than the potential drop threshold and when the input signal IN is at the second potential and the output signal OUT is less than the potential rise threshold, the control unit 130 turns off (that is, disables) the switch unit 120, so that the switch unit 120 can cut off the fast charging path from the input terminal T1 to the output terminal T2 (step S33B).

Figure 11:
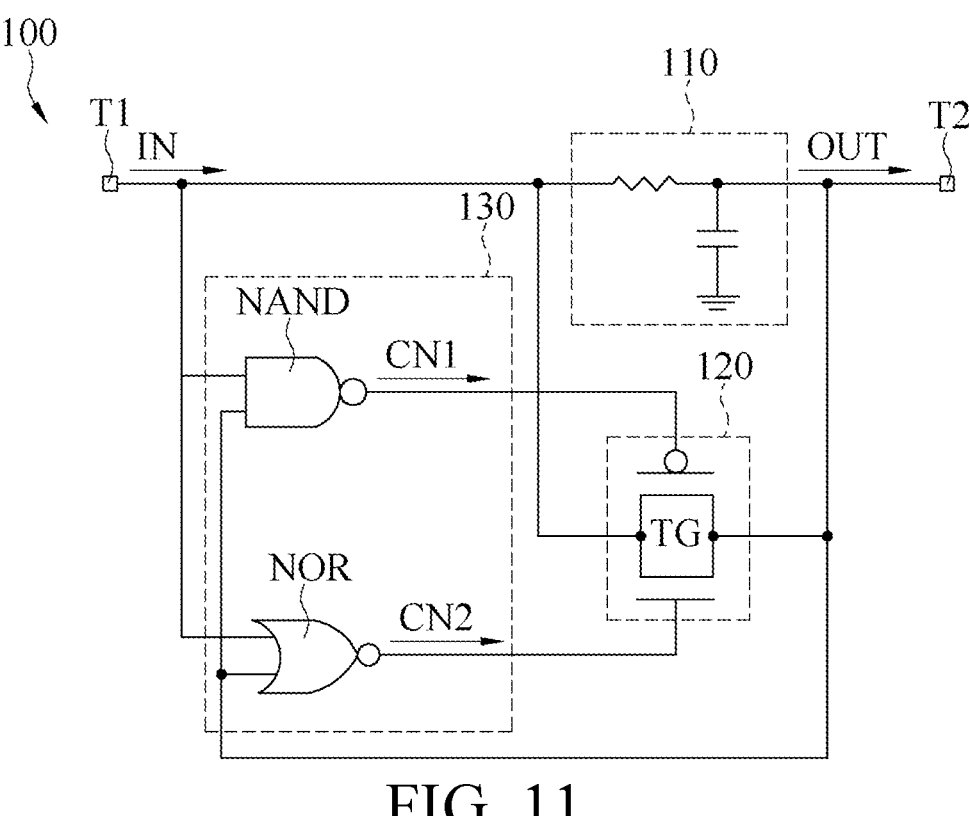
FIG. 11 is a schematic circuit diagram of an embodiment of the slew rate mitigation circuit.
Figure 12:
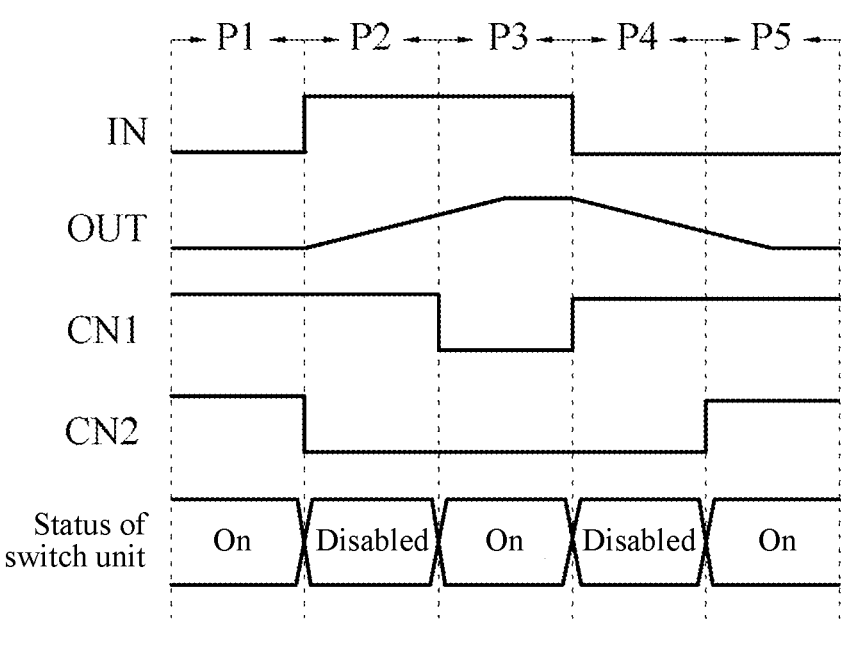
FIG. 12 is a schematic waveform diagram of an embodiment of the slew rate mitigation circuit.

FIG. 11 is a schematic circuit diagram of an embodiment of the slew rate mitigation circuit. FIG. 12 is a schematic waveform diagram of an embodiment of the slew rate mitigation circuit. Referring to FIG. 11 and FIG. 12, In an implementation, the switch unit 120 is implemented by using (including) a transmission gate TG, and the control unit 130 is realized by using (including) a NAND gate and a NOR gate. Two input terminals of the NAND gate are respectively coupled to the input terminal T1 and the output terminal T2, and two input terminals of the NOR gate are respectively coupled to the input terminal T1 and the output terminal T2. Two connecting terminals of the transmission gate TG are respectively coupled to the input terminal T1 and the output terminal T2, a P-type control terminal of the transmission gate TG is coupled to an output terminal of the NAND gate, and an N-type control terminal of the transmission gate TG is coupled to an output terminal of the NOR gate. The transmission gate TG has an N-type transmission path controlled by the N-type control terminal and a P-type transmission path controlled by the P-type control terminal between the two connecting terminals thereof. In addition, the control signal CON generated by the control unit 130 may include two control sub-signals CN1 and CN2. The control sub-signal CN1 is generated by the NAND gate, and the control sub-signal CN2 is generated by the NOR gate. A logic transition threshold of the NAND gate is the potential rise threshold, a logic transition threshold of the NOR gate is the potential drop threshold, and the input signal IN may be an ideal square wave. Generally, the potential rise threshold is greater than the potential drop threshold.

As shown in FIG. 12, each operation cycle of the slew rate mitigation circuit 100 is composed of a first period P1, a second period P2, a third period P3, a fourth period P4, a fifth period P5 connected in sequence.

In the first period P1, the input signal IN is at the first potential, and the output signal OUT generated by the slew rate mitigation unit 110 is also at the first potential (which is less than the potential drop threshold). In this case, the NAND gate of the control unit 130 generates the control sub-signal CN1 with the first value to the switch unit 120, and the NOR gate of the control unit 130 generates the control sub-signal CN2 with the first value to the switch unit 120, so that the transmission gate TG of the switch unit 120 can establish a fast charging path from the input terminal T1 to the output terminal T2 according to the control sub-signal CN1 with the first value and the control sub-signal CN2 with the first value. The sub-control signal CN1 with the first value causes the transmission gate TG to cut off the P-type transmission path, and the control sub-signal CN2 with the first value causes the transmission gate TG to establish the N-type transmission path. In other words, the fast charging path established in the first period P1 is the N-type transmission path of the transmission gate TG.

In the second period P2, the input signal IN transitions and rises from the first potential to the second potential. At this time, the output signal OUT also transitions, and the output signal OUT slowly rises from the first potential due to the mitigation from the slew rate mitigation unit 110 (a rising speed depends on the mitigation rate of the slew rate mitigation unit 110). In the second period P2, the output signal OUT is still less than the potential rise threshold, and therefore, the NAND gate of the control unit 130 still generates the control sub-signal CN1 with the first value to the switch unit 120, but the NOR gate of the control unit 130 turns to generate the control sub-signal CN2 with the second value to the switch unit 120, so that the transmission gate TG of the switch unit 120 disables according to the control sub-signal CN1 with the first value and the control sub-signal CN2 with the second value, so as to cut off the fast charging path from the input terminal T1 to the output terminal T2, wherein the control sub-signal CN1 with the first value causes the transmission gate TG to cut off the P-type transmission path, and the control sub-signal CN2 with the second value causes the transmission gate TG to cut off the N-type transmission path. Weak driving force of the output signal OUT in the second period P2 can prevent the post-stage circuit from suffering from serious charge sharing and thereby avoiding generating error codes.

In the third period P3, the input signal IN remains at the second potential, and therefore the NOR gate of the control unit 130 still generates the control sub-signal CN2 with the second value to the switch unit 120, but the NAND gate of the control unit 130 turns to generate the control sub-signal CN1 with the second value to the switch unit 120 in response to the output signal OUT reaching the potential rise threshold, so that the transmission gate TG of the switch unit 120 establishes the fast charging path from the input terminal T1 to the output terminal T2 according to the control sub-signal CN1 with the second value and the control sub-signal CN2 with the second value. The sub-control signal CN1 with the second value causes the transmission gate TG to establish the P-type transmission path, and the control sub-signal CN2 with the second value causes the transmission gate TG to cut off the N-type transmission path. In other words, the fast charging path established in the third period P3 is the P-type transmission path of the transmission gate TG. In this case, the input signal IN can directly push the output terminal T2 through the fast charging path established by the switch unit 120, thereby enhancing the load pushing ability of the output signal OUT. Strong driving force of the output signal OUT in the third period P3 can prevent interference from noise after completion of the transition.

In the fourth period P4, the input signal IN transitions and drops from the second potential to the first potential. At this time, the output signal OUT transitions, and the output signal OUT slowly drops from the second potential due to the mitigation from the slew rate mitigation unit 110 (a dropping speed depends on the mitigation rate of the slew rate mitigation unit 110). In the fourth period P4, the dropped output signal OUT is still greater than the potential drop threshold, and therefore, the NOR gate of the control unit 130 still generates the control sub-signal CN2 with the second value to the switch unit 120, but the NAND gate of the control unit 130 turns to generate the control sub-signal CN1 with the first value to the switch unit 120, so that the transmission gate TG of the switch unit 120 disables according to the control sub-signal CN1 with the first value and the control sub-signal CN2 with the second value, so as to cut off the fast charging path from the input terminal T1 to the output terminal T2, wherein the control sub-signal CN1 with the first value causes the transmission gate TG to cut off the P-type transmission path, and the control sub-signal CN2 with the second value causes the transmission gate TG to cut off the N-type transmission path. Weak driving force of the output signal OUT in the fourth period P4 can prevent the post-stage circuit from suffering from serious charge sharing and thereby avoiding generating error codes.

In the fifth period P5, the input signal IN remains at the first potential, and therefore the NAND gate of the control unit still generates the control sub-signal CN1 with the first value to the switch unit 120, but the NOR gate of the control unit 130 turns to generate the control sub-signal CN2 with the first value to the switch unit 120 in response to the output signal OUT dropping to the potential drop threshold, so that the transmission gate TG of the switch unit 120 establishes the fast charging path from the input terminal T1 to the output terminal T2 according to the control sub-signal CN1 with the first value and the control sub-signal CN2 with the first value. The sub-control signal CN1 with the first value causes the transmission gate TG to cut off the P-type transmission path, and the control sub-signal CN2 with the first value causes the transmission gate TG to establish the N-type transmission path. In other words, the fast charging path established in the fifth period P5 is the N-type transmission path of the transmission gate TG. In this case, the input signal IN can directly push the output terminal T2 through the fast charging path established by the switch unit 120, thereby enhancing the load pushing ability of the output signal OUT. Strong driving force of the output signal OUT in the fifth period P5 can prevent interference from noise after completion of the transition.

In some embodiments, the slew rate mitigation circuit 100 may repeatedly perform the process from the first period P1 to the fifth period P5.

In some embodiments, the control unit 130 may include a hysteresis circuit 131, and the hysteresis circuit 131 is coupled between the output terminal T2 and the switch unit 120. The hysteresis circuit 131 has two logic transition thresholds (which may be respectively referred to as a high logic transition threshold and a low logic transition threshold). The hysteresis circuit 131 is configured to generate a hysteresis signal OUT1 according to the high logic transition threshold (which is, for example, but is not limited to 0.7 V), the low logic transition threshold (which is, for example, but is not limited to 0.3 V) and the output signal OUT on the output terminal T2, and the hysteresis signal OUT1 generated by the hysteresis circuit 131 is used for delaying a start time point of the fast charging path.

Figure 13:
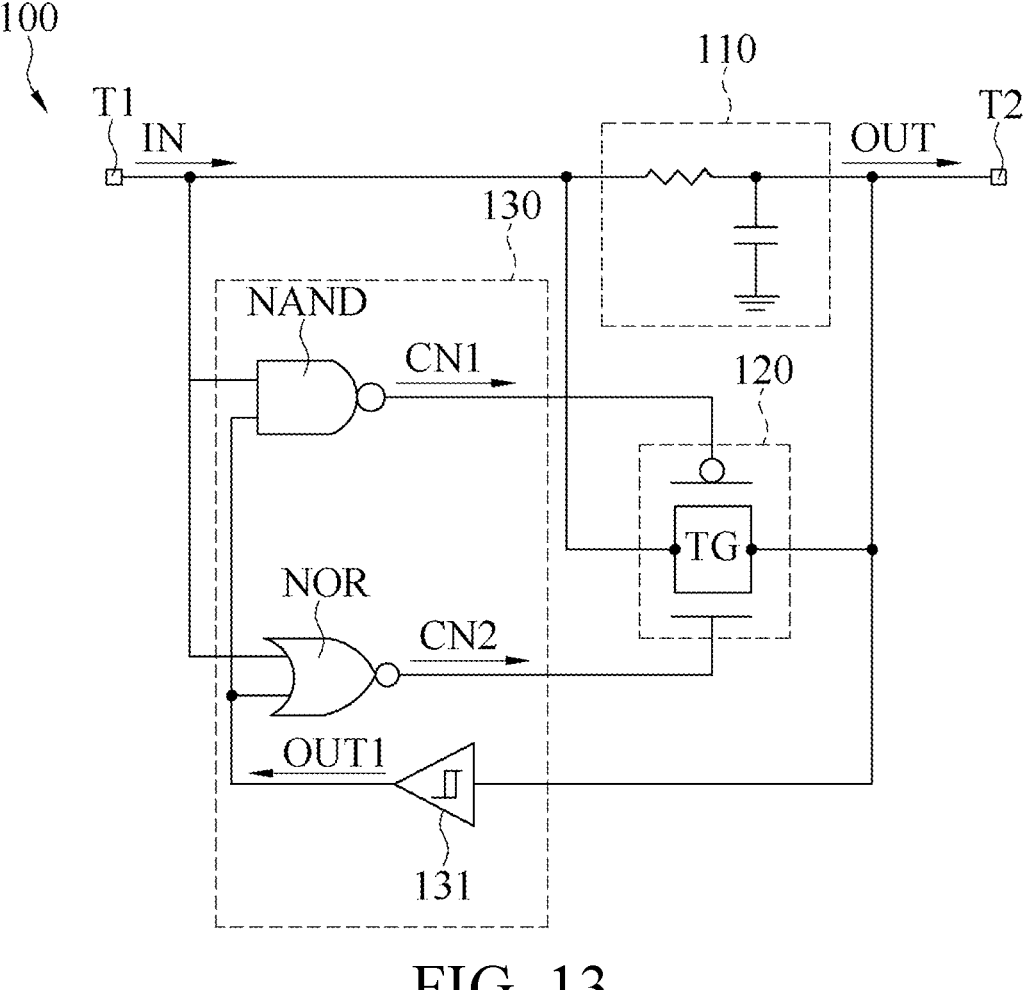
FIG. 13 is a schematic circuit diagram of an embodiment of the slew rate mitigation circuit.

In some implementations, as shown in FIG. 13, an input terminal of the hysteresis circuit 131 may be coupled to the output terminal T2, and an output terminal of the hysteresis circuit 131 may be coupled to the input terminal of the NAND gate and the input terminal of the NOR gate. The hysteresis signal OUT1 generated by the hysteresis circuit 131 delays a time point at which the NAND gate establishes the P-type transmission path of the transmission gate TG, and delays a time point at which the NOR gate establishes the N-type transmission path of the transmission gate TG. The potential rise threshold and the potential drop threshold are respectively the high logic transition threshold and the low logic transition threshold of the hysteresis circuit 131. In some implementations, the hysteresis circuit 131 may be implemented by a hysteresis buffer, but the present invention is not limited thereto.

In some embodiments, the control unit 130 may include a delay circuit 132, and the delay circuit 132 is coupled between the output terminal T2 and the switch unit 120. The delay circuit 132 has a time delay amount. The delay circuit 132 is configured to delay the output signal OUT as a delay signal OUT2 according to the time delay amount, and the delay signal OUT2 generated by the delay circuit 132 is used for delaying a start time point of the fast charging path.

Figure 14:
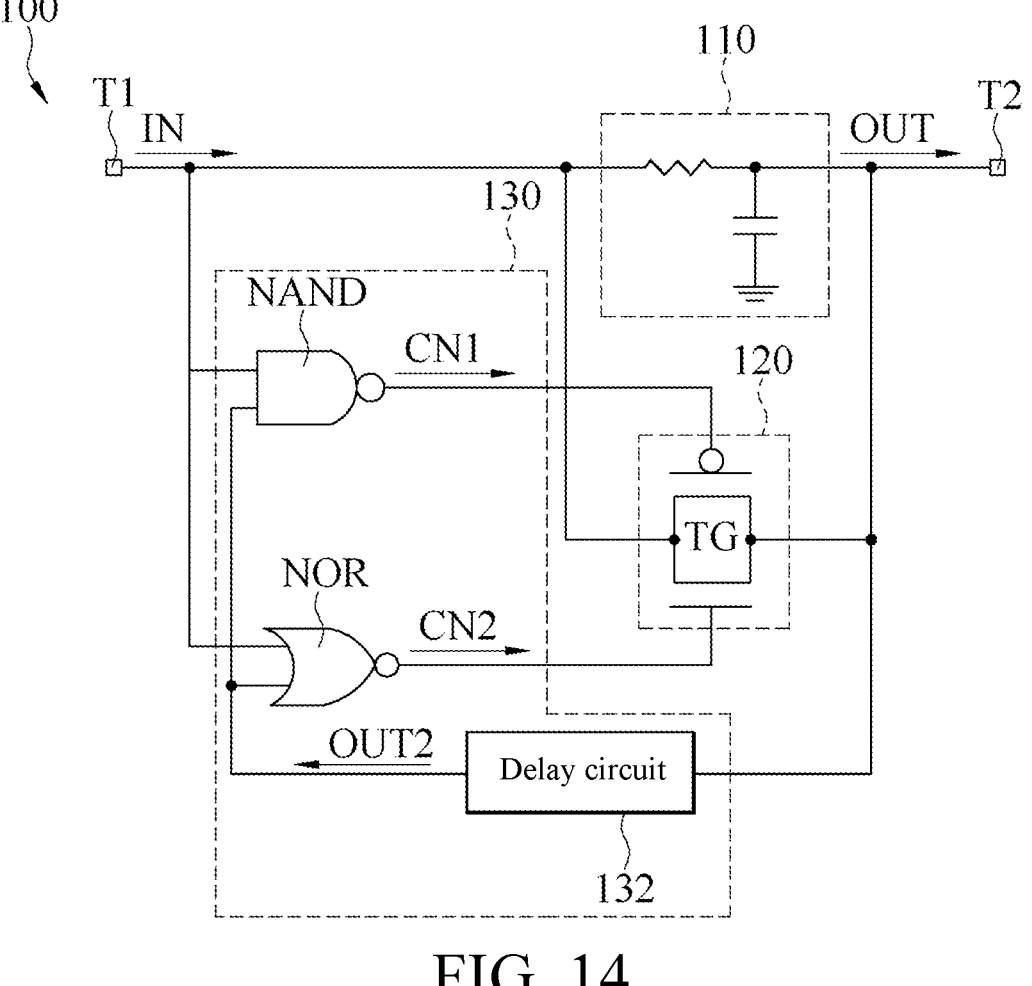
FIG. 14 is a schematic circuit diagram of an embodiment of the slew rate mitigation circuit.

In some implementations, as shown in FIG. 14, an input terminal of the delay circuit 132 may be coupled to the output terminal T2, and an output terminal of the delay circuit 132 may be coupled to the input terminal of the NAND gate and the input terminal of the NOR gate. The delay signal OUT2 generated by the delay circuit 132 delays the time point at which the NAND gate establishes the P-type transmission path of the transmission gate TG, and delays the time point at which the NOR gate establishes the N-type transmission path of the transmission gate TG. The potential rise threshold is the logic transition threshold of the NAND gate, and the potential drop threshold is the logic transition threshold of the NOR gate. In some implementations, the delay circuit 132 may be implemented by a delay buffer or a delay line, but the present invention is not limited thereto.

According to the slew rate mitigation circuit and the slew rate mitigation method of any embodiment, the output signal OUT is generated at the output terminal T2 at the mitigation rate according to the input signal IN, and the fast charging path from the input terminal T1 to the output terminal T2 is selectively established according to the output signal OUT, so that the output signal OUT can have weak driving force at an initial stage of transition to prevent the post-stage circuit from suffering from serious charge sharing, that is, prevent a non-ideal effect (such as charge sharing) caused by fast transition, and the output signal OUT can have strong driving force in a late stage of transition to prevent interference from noise after the transition.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:
1. A slew rate mitigation circuit, comprising:
a slew rate mitigation unit, configured to receive an input signal through an input terminal and generate an output signal at an output terminal at a mitigation rate according to the input signal;
a switch unit, coupled between the input terminal and the output terminal; and
a control unit, coupled to the output terminal and the switch unit and configured to selectively turn on the switch unit according to the output signal, wherein the switch unit establishes a fast charging path from the input terminal to the output terminal when turned on and cuts off the fast charging path when turned off;
wherein, when the output signal is greater than or equal to a first potential rise threshold, the control unit turns on the switch unit, and when the output signal is less than the first potential rise threshold, the control unit turns off the switch unit;

wherein the switch unit comprises a P-type transistor, the control unit comprises a first inverter, an output terminal of the first inverter is coupled to a control terminal of the P-type transistor, and the first potential rise threshold is a logic transition threshold of the first inverter.

2. The slew rate mitigation circuit according to claim 1, wherein when the output signal is less than or equal to a potential drop threshold, the control unit turns on the switch unit, and when the output signal is greater than the potential drop threshold, the control unit turns off the switch unit.

3. A slew rate mitigation method, comprising:

receiving an input signal through an input terminal;

generating an output signal at an output terminal at a mitigation rate according to the input signal; and selectively establishing a fast charging path from the input terminal to the output terminal according to the output signal;

wherein the step of selectively establishing the fast charging path from the input terminal to the output terminal according to the output signal comprises:

establishing the fast charging path when the output signal is greater than or equal to a first potential rise threshold; and cutting off the fast charging path when the output signal is less than the first potential rise threshold;

wherein, the step of establishing the fast charging path when the output signal is greater than or equal to the first potential rise threshold comprises turning on a P-type transistor coupled between the input terminal and the output terminal by using a first inverter to establish the fast charging path; the step of cutting off the fast charging path when the output signal is less than the first potential rise threshold comprises turning off the P-type transistor by using the first inverter to cut off the fast charging path; and the first potential rise threshold is a logic transition threshold of the first inverter.

4. The slew rate mitigation method according to claim 3, wherein the step of selectively establishing the fast charging path from the input terminal to the output terminal according to the output signal comprises:

establishing the fast charging path when the output signal is less than or equal to a potential drop threshold; and cutting off the fast charging path when the output signal is greater than the potential drop threshold.

* * * * *